(12) United States Patent
Joshi et al.

(10) Patent No.: US 8,812,278 B2
(45) Date of Patent: Aug. 19, 2014

(54) SOBOLEV PRE-CONDITIONER FOR OPTIMIZING ILL-CONDITIONED FUNCTIONALS

(75) Inventors: Pushkar P. Joshi, Fremont, CA (US); Nathan A. Carr, San Jose, CA (US); Tobias O. Martin, Gottmadingen (DE)

(73) Assignee: Adobe Systems Incorporated, San Jose, CA (US)

( * ) Notice: Subject to any disclaimer, the term of this patent is extended or adjusted under 35 U.S.C. 154(b) by 247 days.

(21) Appl. No.: 13/434,216

(22) Filed: Mar. 29, 2012

(65) Prior Publication Data

US 2013/0124160 A1    May 16, 2013

Related U.S. Application Data

(60) Provisional application No. 61/513,502, filed on Jul. 29, 2011.

(51) Int. Cl.
*G06F 17/50* (2006.01)
*G06F 17/11* (2006.01)

(52) U.S. Cl.
CPC ................. *G06F 17/11* (2013.01); *G06F 17/50* (2013.01)
USPC ............................................................ 703/2

(58) Field of Classification Search
CPC ..................................................... G06F 17/50
USPC ......................................................... 703/2, 6
See application file for complete search history.

(56) References Cited

U.S. PATENT DOCUMENTS

2010/0046829 A1* 2/2010 Mahajan et al. .............. 382/159

OTHER PUBLICATIONS

R.J. Renka, "A Simple Explanation of the Sobolev Gradient Method," Jul. 3, 2006, 7 pages.
J. W. Neuberger, "Sobolev Gradients and Differential Equation," Springer, 2010, 153 pages.
J. W. Neuberger and R. J. Renka, "Sobolev Gradients: Introduction, Applications, Problems," Jun. 16, 2002, 14 pages.

* cited by examiner

*Primary Examiner* — Thai Phan
(74) *Attorney, Agent, or Firm* — Wolfe-SBMC

(57) ABSTRACT

Methods and apparatus for providing Sobolev pre-conditioning for optimizing ill-conditioned functionals. A power n is initialized to a maximum power (e.g., 8). For k (e.g., 10) iterations of an optimization pipeline, a matrix M is built by considering all powers of the Laplacian matrix up to the power indicated by n, the Sobolev gradient is computed from the standard gradient, and the computed Sobolev gradient is passed to a numerical optimizer. After the k iterations are complete, if n is at a minimum power (e.g., 1), then the algorithm resets n to the maximum power. Otherwise, n is decremented. For the next k iterations, the matrix M is again built by considering all powers of the Laplacian matrix up to the power indicated by the current value of n. This method is continued until all iterations have completed or until some other terminating condition is reached.

20 Claims, 6 Drawing Sheets

SOBOLEV PRE-CONDITIONER FOR OPTIMIZING ILL-CONDITIONED FUNCTIONALS

PRIORITY INFORMATION

This application claims benefit of priority of U.S. Provisional Application Ser. No. 61/513,502 entitled "Sobolev Preconditioner for Optimizing Ill-Conditioned Functionals" filed Jul. 29, 2011, the content of which is incorporated by reference herein in its entirety.

BACKGROUND

Description of the Related Art

Non-linear numerical optimization is a tool used, for example, in computer graphics, with applications in fundamental areas such as variational shape modeling, surface parameterization, and physical simulation. In a typical non-linear optimizer, a given shape is "optimized," that is, the parameters that define its shape are iteratively modified, such that the energy associated with the shape is minimized. Examples include the Willmore energy minimization for variational shape design, a non-linear angle- and area-preserving energy minimization for parameterization, and a strain minimization for non-linear elasticity simulation.

Sobolev Gradients

Sobolev gradients may provide an efficient method of calculating solutions to a wide variety of systems of partial differential equations. For descriptions of Sobolev gradients, see Neuberger, J. W., and Renka R. J., *Sobolev gradients: Introduction, applications, problems, Contemporary Mathematics* 257 (2004), pp. 85-99; and Renka R. J., *A Simple Explanation of the Sobolev Gradient Method*, (2006). A primary reference for Sobolev gradients is Neuberger, J. W., *Sobolev Gradients and Differential Equations*, Springer Lecture Notes in Mathematics #1670, 1997.

SUMMARY

Various embodiments of methods and apparatus that provide Sobolev pre-conditioning for optimizing ill-conditioned functionals are described. Embodiments may provide a Sobolev gradient-based pre-conditioning algorithm for use with or in numerical optimizers that yields improved computational performance out of the optimizer (e.g., a non-linear optimization pipeline) when compared to conventional methods. The Sobolev pre-conditioning algorithm is general enough for most energy functionals, and may yield relatively better performance using the Sobolev pre-conditioner technique than conventional methods.

Embodiments of a Sobolev pre-conditioning algorithm as described herein may be implemented in a general non-linear optimization pipeline. The Sobolev gradient generated by the Sobolev pre-conditioning algorithm can be used in any numerical optimizer in place of the standard gradient, without needing to change the rest of the system (e.g., the optimization pipeline). Examples of applications for the Sobolev pre-conditioning algorithm may include, but are not limited to, accelerating the non-linear optimization task in variational shape modeling, parameterization (both over a piecewise-linear surface mesh), and elasticity simulation (over a volume mesh).

Embodiments of the Sobolev pre-conditioning algorithm may keep track of the iteration number during the optimization, and break it down into sets of k iterations. For the first k iterations, a matrix M is built by considering all powers of the Laplacian matrix, until a maximum power n. For the next k iterations, the matrix M may be built by considering powers of the Laplacian matrix up to n−1. For the next k iterations, embodiments may consider the Laplacian matrices up to power n−2, and so on. In this way, embodiments may continue to reduce the maximum power of the Laplacian matrix that is used to construct the Sobolev pre-conditioner. Once n=a minimum value, embodiments may re-start the process for the next k iterations by setting n to the maximum initial value. In at least some embodiments, k may be chosen to be 10, but other values could be used as well. In at least some embodiments, the maximum power n=8, but other values could be used as well.

In an example embodiment of the Sobolev pre-conditioning algorithm, an iteration counter may be initialized, for example to 0. A matrix M may be built by considering all powers of the Laplacian matrix up to the power indicated by n, and the Sobolev gradient is computed from the standard gradient. The iteration counter is incremented. The Sobolev gradient is then passed to the numerical optimizer. After the optimization, if there are more iterations to be performed by the optimizer pipeline, then the iteration counter is checked to see if the iteration maximum k has been reached. If the counter is less than k, then the algorithm repeats beginning with the building of a matrix M without decrementing the value of n. If the counter is at k, the value of n is checked. If n is equal to a minimum value (e.g. n=1), then the algorithm resets n to the maximum power (e.g., n=8) and repeats. Otherwise, n is decremented (e.g., by subtracting 1), and the algorithm re-initializes the iteration counter to begin the next k iterations using the current value of n.

Figure 1:
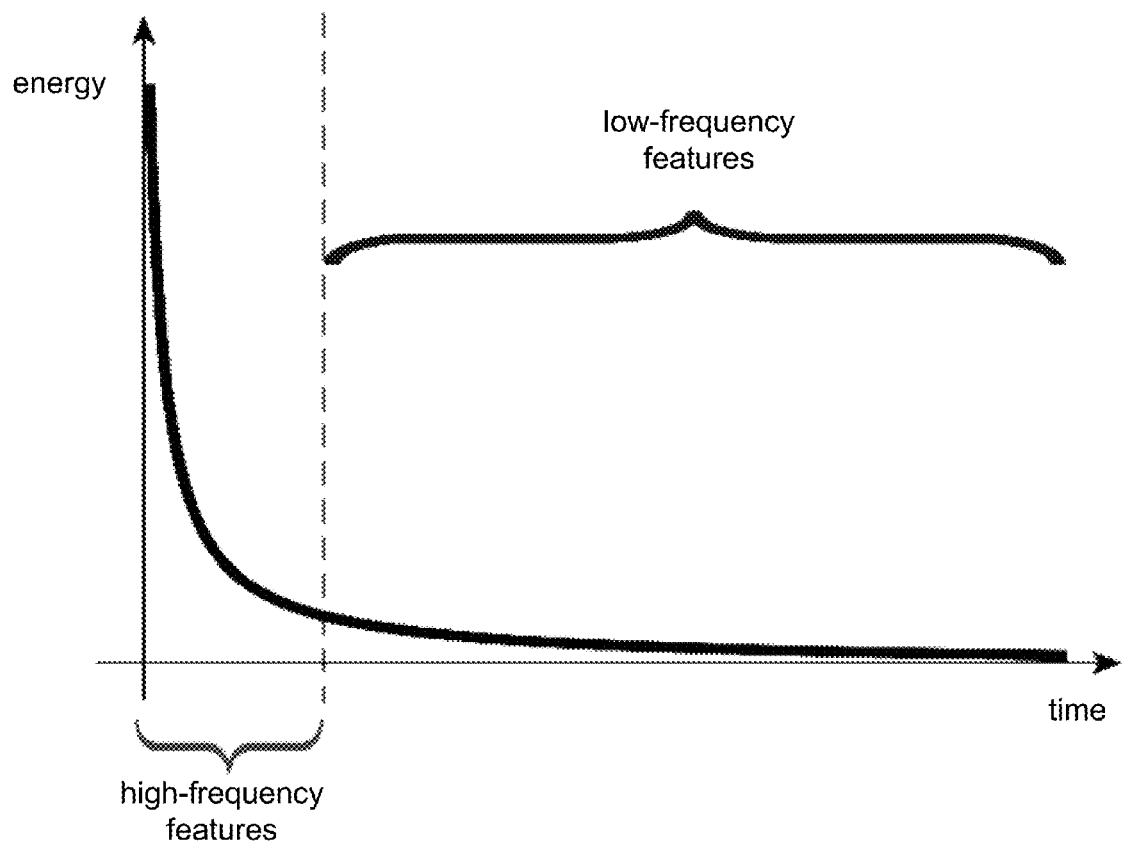
FIG. 1 illustrates an example plot of energy versus number of iterations and shows a plateau-like effect.

While the invention is described herein by way of example for several embodiments and illustrative drawings, those skilled in the art will recognize that the invention is not limited to the embodiments or drawings described. It should be understood, that the drawings and detailed description thereto are not intended to limit the invention to the particular form disclosed, but on the contrary, the intention is to cover all modifications, equivalents and alternatives falling within the spirit and scope of the present invention. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include", "including", and "includes" mean including, but not limited to.

DETAILED DESCRIPTION OF EMBODIMENTS

In the following detailed description, numerous specific details are set forth to provide a thorough understanding of claimed subject matter. However, it will be understood by those skilled in the art that claimed subject matter may be practiced without these specific details. In other instances, methods, apparatuses or systems that would be known by one of ordinary skill have not been described in detail so as not to obscure claimed subject matter.

Some portions of the detailed description which follow are presented in terms of algorithms or symbolic representations of operations on binary digital signals stored within a memory of a specific apparatus or special purpose computing device or platform. In the context of this particular specification, the term specific apparatus or the like includes a general purpose computer once it is programmed to perform particular functions pursuant to instructions from program software. Algorithmic descriptions or symbolic representations are examples of techniques used by those of ordinary skill in the signal processing or related arts to convey the substance of their work to others skilled in the art. An algorithm is here, and is generally, considered to be a self-consistent sequence of operations or similar signal processing leading to a desired result. In this context, operations or processing involve physical manipulation of physical quantities. Typically, although not necessarily, such quantities may take the form of electrical or magnetic signals capable of being stored, transferred, combined, compared or otherwise manipulated. It has proven convenient at times, principally for reasons of common usage, to refer to such signals as bits, data, values, elements, symbols, characters, terms, numbers, numerals or the like. It should be understood, however, that all of these or similar terms are to be associated with appropriate physical quantities and are merely convenient labels. Unless specifically stated otherwise, as apparent from the following discussion, it is appreciated that throughout this specification discussions utilizing terms such as "processing," "computing," "calculating," "determining" or the like refer to actions or processes of a specific apparatus, such as a special purpose computer or a similar special purpose electronic computing device. In the context of this specification, therefore, a special purpose computer or a similar special purpose electronic computing device is capable of manipulating or transforming signals, typically represented as physical electronic or magnetic quantities within memories, registers, or other information storage devices, transmission devices, or display devices of the special purpose computer or similar special purpose electronic computing device.

Various embodiments of methods and apparatus that provide Sobolev pre-conditioning for optimizing ill-conditioned functionals are described. Embodiments may provide a Sobolev gradient-based pre-conditioning algorithm for use with or in numerical optimizers that yields improved computational performance out of the optimizer (e.g., a non-linear optimization pipeline) when compared to conventional methods. The Sobolev pre-conditioning algorithm as described herein is general enough for most energy functionals, and may yield relatively better performance using the Sobolev pre-conditioner technique than conventional methods. Examples of applications for the Sobolev pre-conditioning algorithm may include, but are not limited to, accelerating the non-linear optimization task in variational shape modeling, parameterization (both over a piecewise-linear surface mesh), and elasticity simulation (over a volume mesh). Thus, embodiments of a Sobolev pre-conditioning algorithm as described herein may be implemented in a general non-linear optimization pipeline.

Figure 2A:
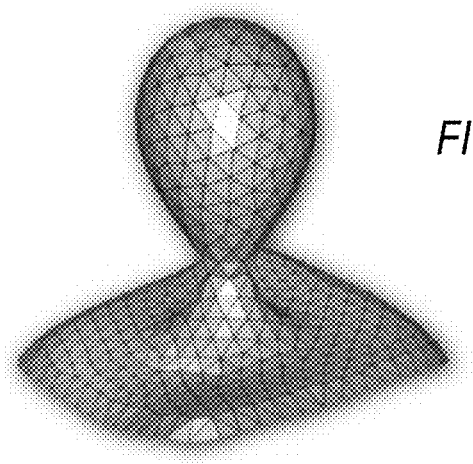
FIG. 2A shows minimizing bending energy of the triangle mesh on the left without boundary conditions.
Figure 2B:
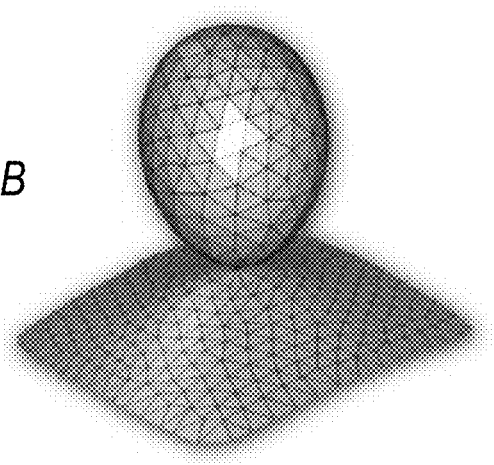
FIG. 2B illustrates converging towards a local minimum, where two entities (sphere and plane) satisfy energy minimum.
Figure 2C:
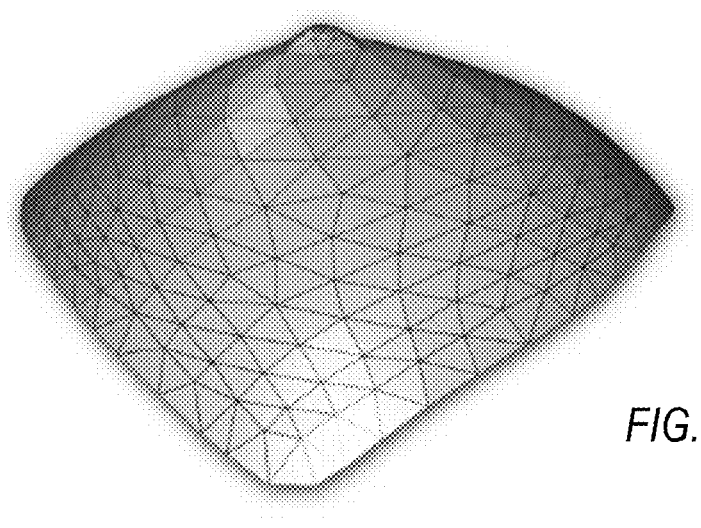
FIG. 2C shows converging towards a global minimum.

In most cases, numerical optimization is a slow process, usually performed off-line for starting shapes that are not already close to being optimal. Typically, after the first few iterations, the rate of energy decrease reduces significantly, and the progress towards the minimum becomes very slow. A typical plot of energy versus number of iterations is shown in FIG. 1 that illustrates a plateau-like effect—the energy drops sharply initially, but then continues to drop by only small amounts later on. Note that the reduction in the rate of energy decrease is not necessarily a sign that the technique is close to the minimum. More often, this is an indication that an ill-conditioned energy (or functional) is being minimized. An ill-conditioned energy is one where a small change in the free parameters causes a large change in the energy value. FIGS. 2A-2C illustrate an example of minimizing bending energy of the triangle mesh shown in FIG. 2A without boundary conditions. FIG. 2B illustrates converging towards a local minimum, where two entities (sphere and plane) satisfy an energy minimum. FIG. 2C shows converging towards a global minimum. While optimizing an ill-conditioned functional over a given shape, the rapid initial decrease in energy is because the shape is modified to become locally optimal. The subsequent slow progress towards the minimum is because the optimizer can make only small changes such that the local optimality is not broken in the path towards global optimality. In other words, the rapid energy decrease is due to the optimization of shape features of high spatial frequency (high-frequency features in FIG. 1); the optimization of shape features of low spatial frequency (low-frequency features in FIG. 1) takes much longer.

Several methods have been introduced to accelerate optimization of ill-conditioned functionals. One such method is pre-conditioning, where the energy gradient (the direction in which the parameters are moved to reduce energy) is modified in order to find a more globally optimal direction. An example pre-conditioner for ill-conditioned functionals is a multi-resolution pre-conditioner—the given shape is represented in a hierarchical fashion (coarse to fine), and the energy gradient with respect to the coarser representation is used to pre-condition the energy gradient with respect to the finer representation. While multi-resolution pre-conditioners may be effective, there are some issues that can keep them from being satisfactory. For example, the input shape cannot be represented hierarchically. As another example, a very coarse representation could move the optimizer in a wrong direction, and backtracking from that direction may be very expensive.

Figure 5:
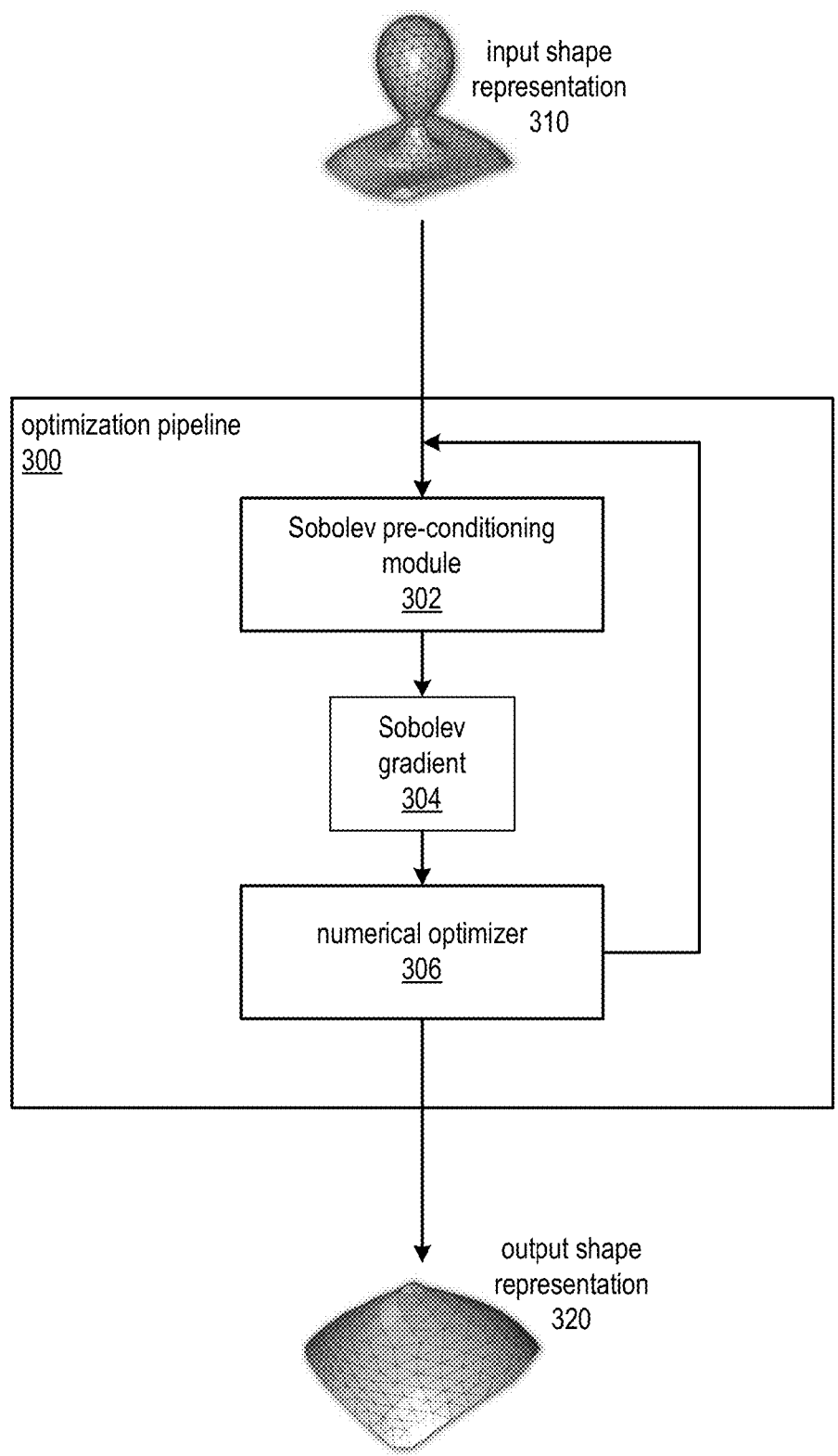
FIG. 5 illustrates an example module that may implement the Sobolev pre-conditioning algorithm, according to at least some embodiments.

Another type of pre-conditioner is known as the Sobolev gradient pre-conditioner, which may also be referred to herein as the Sobolev pre-conditioner. At a high level, the Sobolev pre-conditioner smoothes the standard energy gradient. The smoother gradient allows the optimizer to take bigger steps per iteration towards the desired minimum. Unlike the multi-resolution pre-conditioner, the Sobolev pre-conditioner can be applied to any gradient-based optimization problem and the input shape does not have to be expressed in a multi-resolution representation. The Sobolev pre-conditioner is relatively easy to implement and convenient to deploy: the user simply replaces the module for computing the gradient with a module that returns the Sobolev gradient; the rest of the optimizer remains unchanged. An example Sobolev pre-conditioning module is shown in FIG. 5.

Positive results may be obtained using the Sobolev gradient to accelerate the non-linear optimization task in variational shape modeling and parameterization (both over a piecewise-linear surface mesh), and in elasticity simulation (over a volume mesh), for example. Thus, embodiments of an algorithm for incorporating the Sobolev gradient in a general non-linear optimization pipeline are described.

Sobolev Pre-conditioning Algorithm

Consider the general case of minimizing some numerical energy E continuously defined over some given geometric shape (e.g. a surface or volume) given by a vector x. That is, it is desired to find the $x_{min}$ that minimizes E(x). During the iterative energy minimization, embodiments may make use of the energy gradient g(x) that represents the direction in which the energy is reduced, given the current configuration x.

Construction of the Sobolev gradient involves the construction of a matrix M such that:

$$M = I + \lambda_1 \cdot L - \lambda_2 \cdot L^2 + \lambda_3 \cdot L^3 - \ldots + \lambda_n \cdot L^n \quad (1)$$

where n is the "order" of the Sobolev gradient, L is the Laplacian matrix for the given shape representation, I is the identity matrix and $\lambda_i$ are the weight terms for each of the high-order Laplacian matrices. Multiplying the gradient by the Laplacian matrix has a smoothing effect on the gradient. Multiplying the gradient with a higher power of the Laplacian matrix has a stronger smoothing effect (due to the larger range of influence) on the gradient.

After constructing the matrix M, the Sobolev gradient s(x) may be obtained from the standard gradient g(x) as:

$$s(x) = M^{-1} \cdot g(x) \quad (2).$$

The Sobolev gradient can then be used in any numerical optimizer in place of the standard gradient, without needing to change the rest of the system (e.g., the optimization pipeline). In at least some embodiments the process described above (e.g., equations. 1 and 2) may need to be performed for every iteration of the optimization.

Given the framework above, embodiments may provide a Sobolev pre-conditioning algorithm that yields improved computational performance out of the optimizer (e.g., a non-linear optimization pipeline). Embodiments may keep track of the iteration number during the optimization, and break it down into sets of k iterations. In at least some embodiments, k may be chosen to be 10, but other values could be used as well. For the first k iterations, the matrix M is built as shown in equation 1 by considering all powers of the Laplacian matrix, up to the maximum power n (n=8 in at least some embodiments). For the next k iterations, the matrix M may be built by considering powers of the Laplacian matrix up to power n−1. For the next k iterations, embodiments may consider the Laplacian matrices up to power n−2, and so on. In this way, embodiments may continue to reduce the maximum power of the Laplacian matrix that is used to construct the Sobolev pre-conditioner. Once n=a minimum value (e.g. n=1), embodiments may re-start the process for the next k iterations by resetting n to the maximum initial value (e.g., 8).

Figure 3:
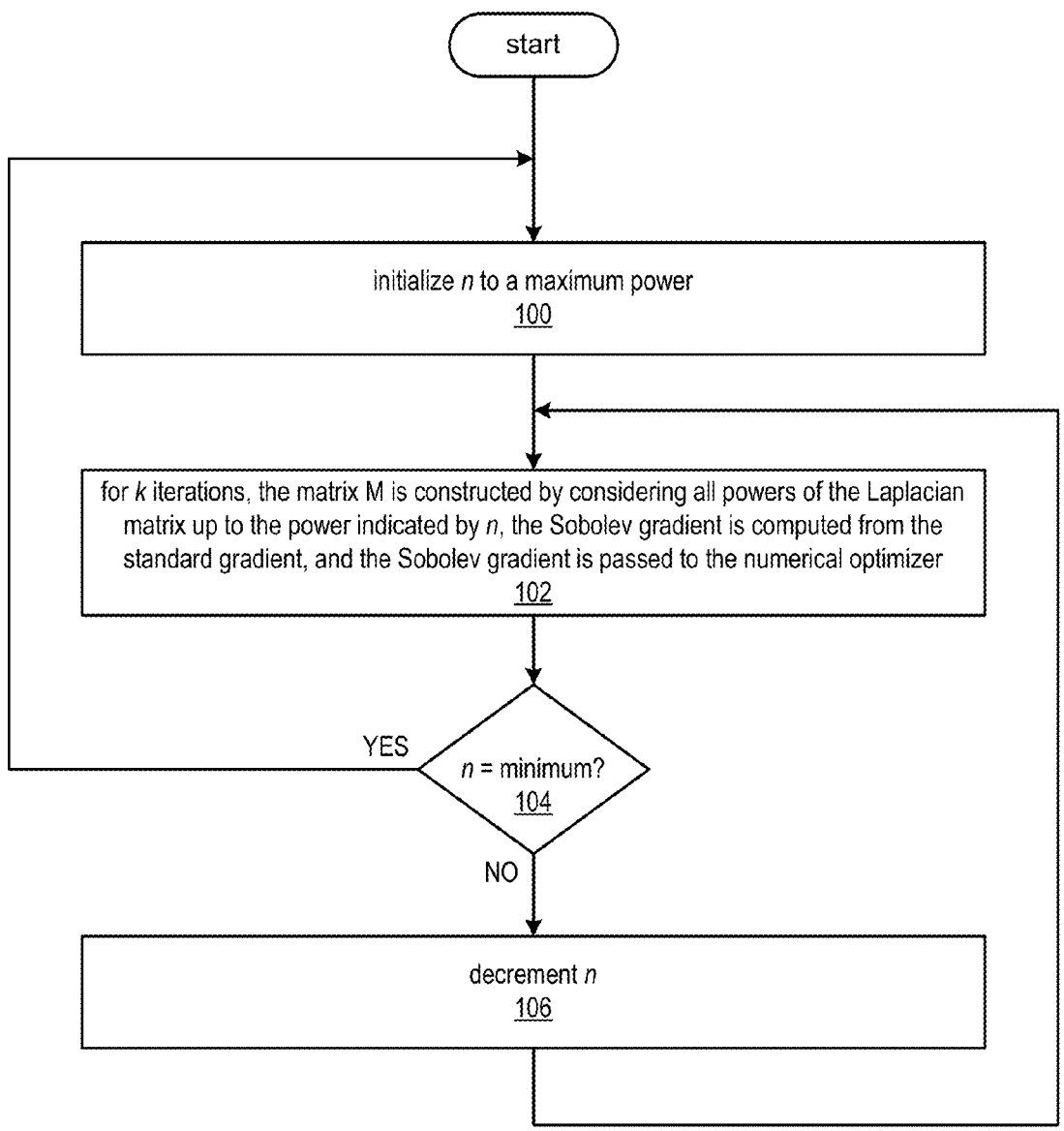
FIG. 3 illustrates an example high-level flowchart for the Sobolev pre-conditioning algorithm, according to at least some embodiments.

FIG. 3 illustrates an example high-level flowchart for the Sobolev pre-conditioning algorithm, according to at least some embodiments, and is not intended to be limiting. As indicated at 100, n is initialized to a maximum power (e.g., 8). As indicated at 102, for k (e.g., 10) iterations, the matrix M is built as shown in equation 1 by considering all powers of the Laplacian matrix up to the power indicated by the current value of n. At each iteration, the Sobolev gradient is obtained from the standard gradient (e.g., according to equation 2), and the Sobolev gradient is passed to the numerical optimizer. If there are more iterations to be performed, at 104, the value of n is checked. If n is equal to a minimum value (e.g. n=1), then the algorithm returns to element 100 where n is reset to the maximum power (e.g., n=8). Otherwise, n is decremented (e.g., by subtracting 1) as indicated at 106, and the algorithm returns to element 102.

In at least some embodiments, the method as shown in FIG. 3 may be performed until the iterations of the optimizer pipeline are completed, or until some other terminating condition or threshold is reached.

Figure 4:
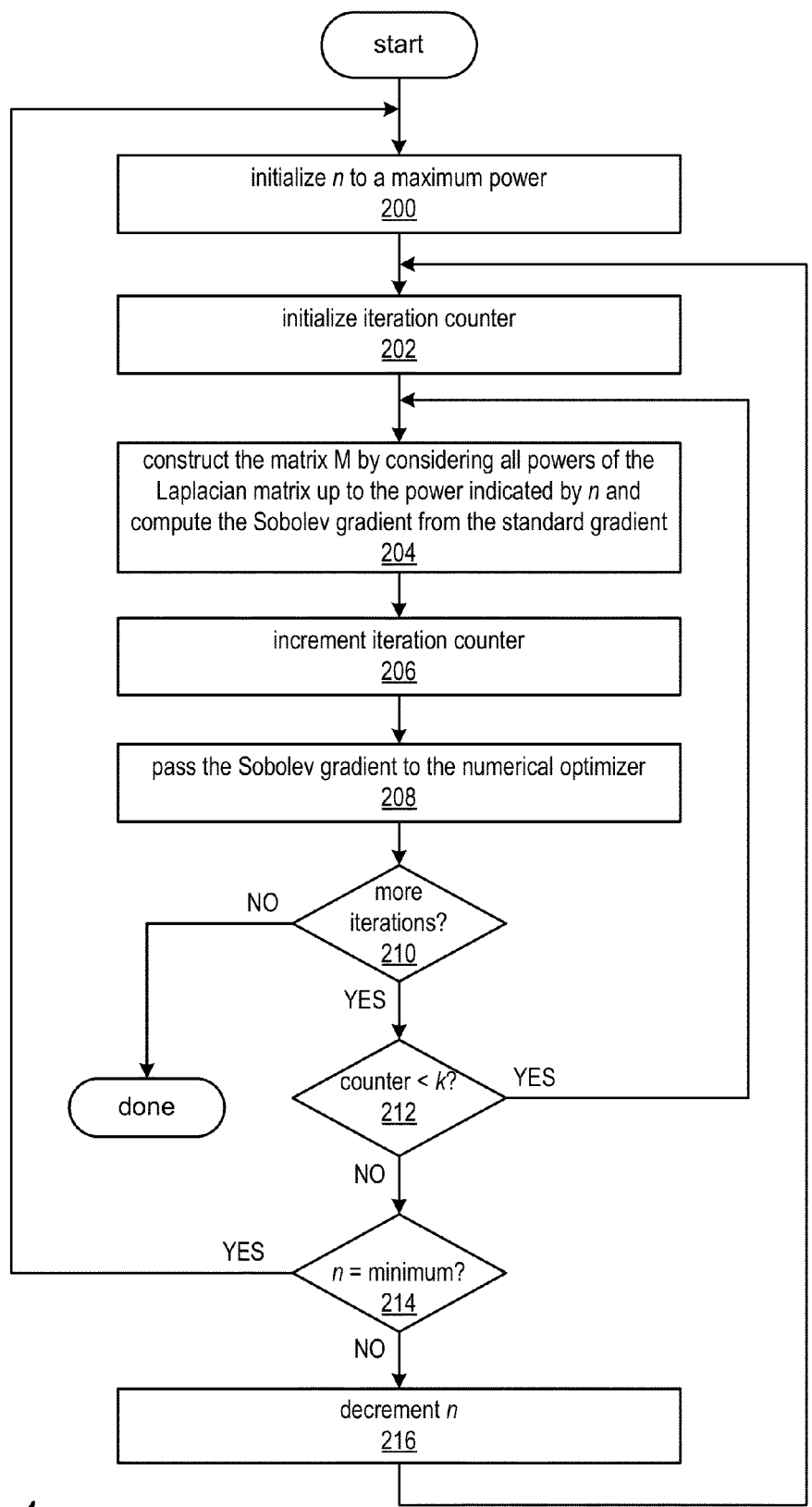
FIG. 4 illustrates an example flowchart for the Sobolev pre-conditioning algorithm in more detail, according to at least some embodiments.

FIG. 4 illustrates an example flowchart for the Sobolev pre-conditioning algorithm in more detail, according to at least some embodiments. As indicated at 200, n is initialized to a maximum power (e.g., 8). As indicated at 202, an iteration counter may be initialized, for example to 0. As indicated at 204, the matrix M is built as shown in equation 1 by considering all powers of the Laplacian matrix up to the power indicated by n, and the Sobolev gradient is computed from the standard gradient (e.g., according to equation 2). As indicated at 206, the iteration counter is incremented. As indicated at 208, the Sobolev gradient is passed to the numerical optimizer.

Embodiments of the Sobolev pre-conditioning algorithm may keep track of the iteration number during the optimization, and break it down into sets of k iterations. In at least some embodiments, k may be chosen to be 10, but other values could be used as well. At 210, if there are more iterations to be performed by the optimizer, then at 212 the iteration counter is checked to see if the iteration maximum k has been reached. If the counter is less than k, then the algorithm returns to 204 without decrementing the value of n. Otherwise, the counter is at k, and at 214, the value of n is checked. If n is equal to a minimum value (e.g. n=1), then the algorithm returns to element 200 where n is reset to the maximum power (e.g., n=8). Otherwise, n is decremented (e.g., by subtracting 1) as indicated at 216, and the algorithm returns to element 202, where the iteration counter is initialized to begin the next k iterations using the current value of n.

At 210, if there are no more iterations to be performed by the optimizer, then the method is done.

Note that the methods shown in FIGS. 3 and 4 represent example embodiments of methods. The order of method may be changed, and various elements may be added, reordered, combined, omitted, modified, etc. For example, in FIG. 4, instead of initializing the iteration counter to a minimum (e.g. 0) and incrementing the counter at each iteration, the iteration counter may be initialized to a maximum (e.g., k) and decremented at each iteration. As another example, the iteration counter may be checked before being incremented (or decremented). As yet another example, the value of n may be decremented before being checked.

Embodiments of the Sobolev pre-conditioning algorithm as described herein are general enough for most energy functionals, and may yield relatively better performance for optimizers using the Sobolev pre-conditioner than do conventional methods.

Example Implementations

Some embodiments may include a means for performing the Sobolev pre-conditioning algorithm in a non-linear optimization pipeline. For example, a Sobolev pre-conditioning module may be provided that implements an embodiment of the Sobolev pre-conditioning algorithm as described herein, for example as illustrated in FIGS. 3 and 4. The Sobolev pre-conditioning module may in some embodiments be implemented by a non-transitory, computer-readable storage medium and one or more processors (e.g., CPUs and/or GPUs) of a computing apparatus. The computer-readable storage medium may store program instructions executable by the one or more processors to cause the computing apparatus to perform the Sobolev pre-conditioning module as described herein. Other embodiments of the Sobolev pre-conditioning module may be at least partially implemented by hardware circuitry and/or firmware stored, for example, in a non-volatile memory.

FIG. 5 illustrates an example Sobolev pre-conditioning module that may implement the Sobolev pre-conditioning algorithm, according to at least some embodiments. A Sobolev pre-conditioning module 302 may be implemented in a general non-linear optimization pipeline 300. An input shape representation 310 may be processed by Sobolev pre-conditioning module 302 to generate a Sobolev gradient 304, for example according to equations 1 and 2. The Sobolev gradient 304 may be input to a numerical optimizer 306. Multiple iterations may be performed as indicated by the arrow returning from numerical optimizer 306 to module 302, with the Sobolev pre-conditioning module 302 tracking the number of iterations performed and breaking the iterations down into sets of k iterations. For the first k iterations, the matrix M is built by module 302 as shown in equation 1 by considering all powers of the Laplacian matrix, up to a maximum power n (n=8 in at least some embodiments). For the next k iterations, the matrix M may be built by module 302 by considering powers of the Laplacian matrix up to power n−1. For the next k iterations, module 302 may consider the Laplacian matrices up to power n−2, and so on. In this way, module 302 may continue to reduce the maximum power of the Laplacian matrix that is used to construct the Sobolev pre-conditioner. Once n=a minimum value (e.g. n=1), module 302 may re-start the process for the next k iterations by resetting n to the maximum initial value (e.g., 8).

A shape representation 320 may by output by the optimization pipeline 300 once all iterations of the optimizer are complete.

Example System

Figure 6:
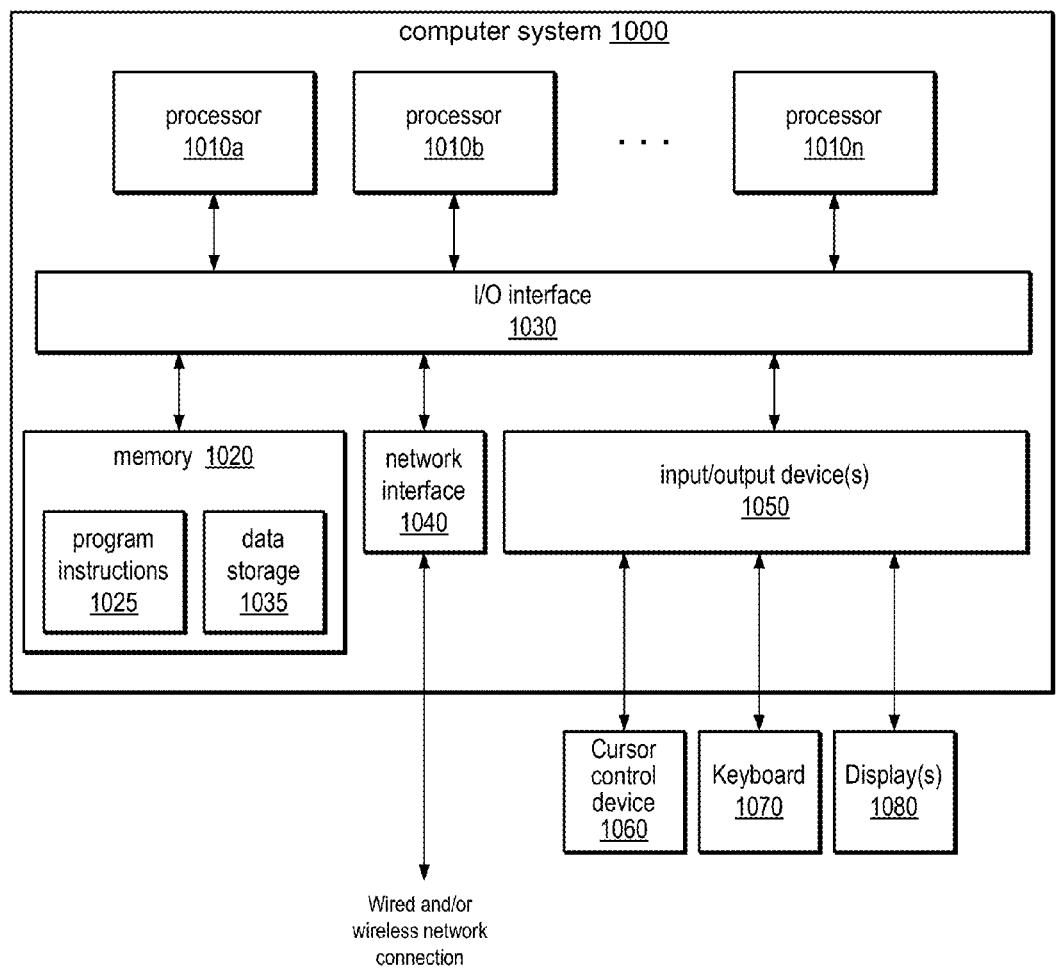
FIG. 6 illustrates an example computer system that may be used in embodiments.

Embodiments of a Sobolev pre-conditioning module and/or algorithm as described herein may be executed on one or more computer systems, which may interact with various other devices. One such computer system is illustrated by FIG. 6. In different embodiments, computer system 1000 may be any of various types of devices, including, but not limited to, a personal computer system, desktop computer, laptop, notebook, or netbook computer, mainframe computer system, handheld computer, workstation, network computer, a camera, a set top box, a mobile device, a consumer device, video game console, handheld video game device, application server, storage device, a peripheral device such as a switch, modem, router, or in general any type of computing or electronic device.

In the illustrated embodiment, computer system 1000 includes one or more processors 1010 coupled to a system memory 1020 via an input/output (I/O) interface 1030. Computer system 1000 further includes a network interface 1040 coupled to I/O interface 1030, and one or more input/output devices 1050, such as cursor control device 1060, keyboard 1070, and display(s) 1080. In some embodiments, it is contemplated that embodiments may be implemented using a single instance of computer system 1000, while in other embodiments multiple such systems, or multiple nodes making up computer system 1000, may be configured to host different portions or instances of embodiments. For example, in one embodiment some elements may be implemented via one or more nodes of computer system 1000 that are distinct from those nodes implementing other elements.

In various embodiments, computer system 1000 may be a uniprocessor system including one processor 1010, or a multiprocessor system including several processors 1010 (e.g., two, four, eight, or another suitable number). Processors 1010 may be any suitable processor capable of executing instructions. For example, in various embodiments, processors 1010 may be general-purpose or embedded processors implementing any of a variety of instruction set architectures (ISAs), such as the x86, PowerPC, SPARC, or MIPS ISAs, or any other suitable ISA. In multiprocessor systems, each of processors 1010 may commonly, but not necessarily, implement the same ISA.

In some embodiments, at least one processor 1010 may be a graphics processing unit. A graphics processing unit or GPU may be considered a dedicated graphics-rendering device for a personal computer, workstation, game console or other computing or electronic device. Modern GPUs may be very efficient at manipulating and displaying computer graphics, and their highly parallel structure may make them more effective than typical CPUs for a range of complex graphical algorithms. For example, a graphics processor may implement a number of graphics primitive operations in a way that makes executing them much faster than drawing directly to the screen with a host central processing unit (CPU). In various embodiments, the image processing methods disclosed herein may, at least in part, be implemented by program instructions configured for execution on one of, or parallel execution on two or more of, such GPUs. The GPU(s) may implement one or more application programmer interfaces (APIs) that permit programmers to invoke the functionality of the GPU(s). Suitable GPUs may be commercially available from vendors such as NVIDIA Corporation, ATI Technologies (AMD), and others.

System memory 1020 may be configured to store program instructions and/or data accessible by processor 1010. In various embodiments, system memory 1020 may be implemented using any suitable memory technology, such as static random access memory (SRAM), synchronous dynamic RAM (SDRAM), nonvolatile/Flash-type memory, or any other type of memory. In the illustrated embodiment, program instructions and data implementing desired functions, such as those described above for embodiments of a Sobolev pre-conditioning module and/or algorithm are shown stored within system memory 1020 as program instructions 1025 and data storage 1035, respectively. In other embodiments, program instructions and/or data may be received, sent or stored upon different types of computer-accessible media or on similar media separate from system memory 1020 or computer system 1000. Generally speaking, a computer-accessible medium may include storage media or memory media such as magnetic or optical media, e.g., disk or CD/DVD-ROM coupled to computer system 1000 via I/O interface 1030. Program instructions and data stored via a computer-accessible medium may be transmitted by transmission media or signals such as electrical, electromagnetic, or digital signals, which may be conveyed via a communication medium such as a network and/or a wireless link, such as may be implemented via network interface 1040.

In one embodiment, I/O interface 1030 may be configured to coordinate I/O traffic between processor 1010, system memory 1020, and any peripheral devices in the device, including network interface 1040 or other peripheral interfaces, such as input/output devices 1050. In some embodiments, I/O interface 1030 may perform any necessary protocol, timing or other data transformations to convert data signals from one component (e.g., system memory 1020) into a format suitable for use by another component (e.g., processor 1010). In some embodiments, I/O interface 1030 may include support for devices attached through various types of peripheral buses, such as a variant of the Peripheral Component Interconnect (PCI) bus standard or the Universal Serial Bus (USB) standard, for example. In some embodiments, the function of I/O interface 1030 may be split into two or more separate components, such as a north bridge and a south bridge, for example. In addition, in some embodiments some or all of the functionality of I/O interface 1030, such as an interface to system memory 1020, may be incorporated directly into processor 1010.

Network interface 1040 may be configured to allow data to be exchanged between computer system 1000 and other devices attached to a network, such as other computer systems, or between nodes of computer system 1000. In various embodiments, network interface 1040 may support communication via wired or wireless general data networks, such as any suitable type of Ethernet network, for example; via telecommunications/telephony networks such as analog voice networks or digital fiber communications networks; via storage area networks such as Fibre Channel SANs, or via any other suitable type of network and/or protocol.

Input/output devices 1050 may, in some embodiments, include one or more display terminals, keyboards, keypads, touchpads, scanning devices, voice or optical recognition devices, or any other devices suitable for entering or retrieving data by one or more computer system 1000. Multiple input/output devices 1050 may be present in computer system 1000 or may be distributed on various nodes of computer system 1000. In some embodiments, similar input/output devices may be separate from computer system 1000 and may interact with one or more nodes of computer system 1000 through a wired or wireless connection, such as over network interface 1040.

As shown in FIG. 6, memory 1020 may include program instructions 1025, configured to implement embodiments of a Sobolev pre-conditioning module and/or algorithm as described herein, and data storage 1035, comprising various data accessible by program instructions 1025. In one embodiment, program instructions 1025 may include software elements of embodiments of a Sobolev pre-conditioning module and/or algorithm as illustrated in the above Figures. Data storage 1035 may include data that may be used in embodiments. In other embodiments, other or different software elements and data may be included.

Those skilled in the art will appreciate that computer system 1000 is merely illustrative and is not intended to limit the scope of a Sobolev pre-conditioning module and/or algorithm as described herein. In particular, the computer system and devices may include any combination of hardware or software that can perform the indicated functions, including a computer, personal computer system, desktop computer, laptop, notebook, or netbook computer, mainframe computer system, handheld computer, workstation, network computer, a camera, a set top box, a mobile device, network device, internet appliance, PDA, wireless phones, pagers, a consumer device, video game console, handheld video game device, application server, storage device, a peripheral device such as a switch, modem, router, or in general any type of computing or electronic device. Computer system 1000 may also be connected to other devices that are not illustrated, or instead may operate as a stand-alone system. In addition, the functionality provided by the illustrated components may in some embodiments be combined in fewer components or distributed in additional components. Similarly, in some embodiments, the functionality of some of the illustrated components may not be provided and/or other additional functionality may be available.

Those skilled in the art will also appreciate that, while various items are illustrated as being stored in memory or on storage while being used, these items or portions of them may be transferred between memory and other storage devices for purposes of memory management and data integrity. Alternatively, in other embodiments some or all of the software components may execute in memory on another device and communicate with the illustrated computer system via inter-computer communication. Some or all of the system components or data structures may also be stored (e.g., as instructions or structured data) on a computer-accessible medium or a portable article to be read by an appropriate drive, various examples of which are described above. In some embodiments, instructions stored on a computer-accessible medium separate from computer system 1000 may be transmitted to computer system 1000 via transmission media or signals such as electrical, electromagnetic, or digital signals, conveyed via a communication medium such as a network and/or a wireless link. Various embodiments may further include receiving, sending or storing instructions and/or data implemented in accordance with the foregoing description upon a computer-accessible medium. Accordingly, the present invention may be practiced with other computer system configurations.

Conclusion

Various embodiments may further include receiving, sending or storing instructions and/or data implemented in accordance with the foregoing description upon a computer-accessible medium. Generally speaking, a computer-accessible medium may include storage media or memory media such as magnetic or optical media, e.g., disk or DVD/CD-ROM, volatile or non-volatile media such as RAM (e.g. SDRAM, DDR, RDRAM, SRAM, etc.), ROM, etc., as well as transmission media or signals such as electrical, electromagnetic, or digital signals, conveyed via a communication medium such as network and/or a wireless link.

The various methods as illustrated in the Figures and described herein represent example embodiments of methods. The methods may be implemented in software, hardware, or a combination thereof. The order of method may be changed, and various elements may be added, reordered, combined, omitted, modified, etc.

Various modifications and changes may be made as would be obvious to a person skilled in the art having the benefit of this disclosure. It is intended that the invention embrace all such modifications and changes and, accordingly, the above description to be regarded in an illustrative rather than a restrictive sense.

What is claimed is:

1. A method implemented by one or more computing devices, the method comprising:
   receiving, from one or more input devices, a shape representation;
   generating, from the shape representation, a first gradient for the shape;
   initializing a power n to a maximum power value;
   repeating, for k iterations:
   constructing a matrix M from powers of a Laplacian matrix for the shape representation up to the power n;
   constructing a Sobolev gradient by multiplying the first gradient for the shape by the inverse of the matrix M; and
   if n is greater than a minimum power value, decrementing n by one;

repeating, until a terminating condition has been reached:
resetting n to a maximum power value;
for k iterations:
constructing a matrix M from powers of a Laplacian matrix for the shape representation up to the power n;
constructing a Sobolev gradient by multiplying the Sobolev gradient constructed from the previous k iterations by the inverse of the matrix M; and
if n is greater than a minimum power value, decrementing n by one; and
responsive to a determination that a terminating condition has been reached, outputting an output shape representation resulting from the repeating of the k iterations.

2. The method of claim 1, wherein the matrix M is constructed according to the equation:

$$M = I + \lambda_1 \cdot L - \lambda_2 \cdot L^2 + \lambda_3 \cdot L^3 - \ldots + \lambda_n \cdot L^n$$

where n represents the order of a Sobolev gradient, L represents the Laplacian matrix for the shape representation, I represents an identity matrix, and $\lambda_i$ represents weight terms for each Laplacian matrix.

3. The method of claim 1, wherein the Sobolev gradients are constructed according to the equation:

$$s(x) = M^{-1} \cdot g(x)$$

where x is a vector representation of the shape representation, g(x) is the first gradient for the shape, and s(x) is the Sobolev gradient.

4. The method of claim 1, wherein the value of k is designated by a user.

5. The method of claim 1, wherein n is designated by a user.

6. The method of claim 1, wherein the minimum power value is one (1).

7. The method of claim 1, wherein the terminating condition is an indication that a maximum number of k iterations has been reached.

8. A system, comprising:
a memory; and
one or more processors coupled to the memory, having stored thereon program instructions executable by the one or more processors to perform operations comprising:
receiving a shape representation;
generating, from the shape representation, a first gradient for the shape;
initializing a power n to a maximum power value;
repeating, for k iterations:
constructing a matrix M from powers of a Laplacian matrix for the shape representation up to the power n;
constructing a Sobolev gradient by multiplying the first gradient for the shape by the inverse of the matrix M; and
if n is greater than a minimum power value, decrementing n by one;
repeating, until a terminating condition has been reached:
resetting n to a maximum power value;
for k iterations:
constructing a matrix M from powers of a Laplacian matrix for the shape representation up to the power n;
constructing a Sobolev gradient by multiplying the Sobolev gradient constructed from the previous k iterations by the inverse of the matrix M; and
if n is greater than a minimum power value, decrementing n by one; and
responsive to a determination of a terminating condition, outputting a shape representation resulting from the repeating of k iterations.

9. The system of claim 8, wherein the matrix M is constructed according to the equation:

$$M = I + \lambda_1 \cdot L - \lambda_2 \cdot L^2 + \lambda_3 \cdot L^3 - \ldots + \lambda_n \cdot L^n$$

where n represents the order of a Sobolev gradient, L represents the Laplacian matrix for the shape representation, I represents an identity matrix, and $\lambda_i$ represents weight terms for each Laplacian matrix.

10. The system of claim 8, wherein the Sobolev gradients are constructed according to the equation:

$$s(x) = M^{-1} \cdot g(x)$$

where x is a vector representation of the shape representation, g(x) is the first gradient for the shape, and s(x) is the Sobolev gradient.

11. The system of claim 8, wherein the value of k is automatically set to ten (10) and may be modified by a user.

12. The system of claim 8, wherein the value of n is automatically set to eight (8) and may be modified by a user.

13. The system of claim 8, wherein the minimum power value is one (1).

14. The system of claim 8, wherein the terminating condition is an indication that a maximum number of k iterations has been reached.

15. A non-transitory computer-readable storage medium, storing computer-executable program instructions on a computer to perform operations comprising:
receiving, from one or more input devices communicatively coupled to the computer, a shape representation;
generating, from the shape representation, a first gradient for the shape;
initializing a power n to a maximum power value;
repeating, for k iterations:
constructing a matrix M from powers of a Laplacian matrix for the shape representation up to the power n;
constructing a Sobolev gradient by multiplying the first gradient for the shape by the inverse of the matrix M; and
if n is greater than a minimum power value, decrementing n by one;
repeating, until a terminating condition occurs:
resetting n to a maximum power value;
for k iterations:
constructing a matrix M from powers of a Laplacian matrix for the shape representation up to the power n;
constructing a Sobolev gradient by multiplying the Sobolev gradient constructed from the previous k iterations by the inverse of the matrix M; and
if n is greater than a minimum power value, decrementing n by one; and
responsive to a determination that a terminating condition has been reached, outputting an output shape representation resulting from the repeating of the k iterations.

16. The non-transitory computer-readable storage medium of claim 15, further comprising constructing matrix M from the equation:

$$M = I + \lambda_1 \cdot L - \lambda_2 \cdot L^2 + \lambda_3 \cdot L^3 - \ldots + \lambda_n \cdot L^n$$

where n represents the order of a Sobolev gradient, L represents the Laplacian matrix for the shape representation, I represents an identity matrix, and $\lambda_i$ represents weight terms for each Laplacian matrix.

17. The non-transitory computer-readable storage medium of claim 15, further comprising constructing the Sobolev gradients from the equation:

$$s(x) = M^{-1} \cdot g(x)$$

where x is a vector representation of the shape representation, g(x) is the first gradient for the shape, and s(x) is the Sobolev gradient.

18. The non-transitory computer-readable storage medium of claim 15, wherein the value of k is designated by a user.

19. The non-transitory computer-readable storage medium of claim 15, wherein the maximum power value is eight (8) and the minimum power value is one (1).

20. The non-transitory computer-readable storage medium of claim 15, wherein the terminating condition is an indication that a maximum number of k iterations has been reached.

* * * * *